(12) United States Patent
Asai

(10) Patent No.: US 10,361,031 B2
(45) Date of Patent: *Jul. 23, 2019

(54) CERAMIC CAPACITOR INCLUDING FIRST, SECOND, AND THIRD EXTERNAL ELECTRODES WRAPPING AROUND SIDE AND PRINCIPAL SURFACES

(71) Applicant: Murata Manufacturing Co., Ltd., Nagaokakyo-shi, Kyoto-fu (JP)

(72) Inventor: Nobutaka Asai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/607,762

(22) Filed: May 30, 2017

(65) Prior Publication Data

US 2017/0345561 A1 Nov. 30, 2017

(30) Foreign Application Priority Data

May 31, 2016 (JP) .................................. 2016-108586

(51) Int. Cl.
*H01G 4/232* (2006.01)
*H01G 4/30* (2006.01)
(Continued)

(52) U.S. Cl.
CPC ............ *H01G 4/232* (2013.01); *H01G 4/005* (2013.01); *H01G 4/306* (2013.01); *C23C 14/34* (2013.01); *H01G 4/1209* (2013.01)

(58) Field of Classification Search
CPC ........ H01G 4/005; H01G 4/1209; H01G 4/306
See application file for complete search history.

(56) References Cited

U.S. PATENT DOCUMENTS 6,388,864 B1 * 5/2002 Nakagawa ............... H01G 2/14
                                                        361/306.3
6,445,593 B1 * 9/2002 Okuyama ........... H01F 17/0013
                                                        257/421

(Continued)

FOREIGN PATENT DOCUMENTS

JP       06-251981 A       9/1994
JP       11121251 A  *    4/1999
(Continued)

OTHER PUBLICATIONS

Shimada, "Ceramic Capacitor," U.S. Appl. No. 15/608,126, filed May 30, 2017.

(Continued)

*Primary Examiner* — David M Sinclair
(74) *Attorney, Agent, or Firm* — Keating & Bennett, LLP

(57) ABSTRACT

In a ceramic capacitor which is low in ESL and suitable to be built into a substrate, widths of portions of a third external electrode on first and second principal surfaces in a length direction are A, widths of portions of the third external electrode on first and second side surfaces in the length direction are B, A>B is satisfied, and widths of portions of first and second external electrodes on the first and second principal surfaces in the length direction are C, widths of portions of the first and second external electrodes on the first and second side surfaces in the length direction are denoted by D, C>D is satisfied.

18 Claims, 11 Drawing Sheets

(51) Int. Cl.
*H01G 4/005* (2006.01)
*C23C 14/34* (2006.01)
*H01G 4/12* (2006.01)

(56) References Cited

U.S. PATENT DOCUMENTS

| | | | |
|---|---|---|---|
| 6,610,925 B1* | 8/2003 | Wajima | H01C 1/142 174/535 |
| 2001/0019176 A1* | 9/2001 | Ahiko | H01G 4/012 257/777 |
| 2009/0284896 A1* | 11/2009 | Sakaguchi | H01G 4/005 361/303 |
| 2012/0194031 A1* | 8/2012 | Ogawa | H01G 4/005 310/311 |
| 2014/0126106 A1 | 5/2014 | Sawada | |
| 2015/0014037 A1* | 1/2015 | Ahn | H01G 4/30 174/260 |
| 2015/0041198 A1* | 2/2015 | Lee | H01G 2/06 174/260 |
| 2015/0109718 A1* | 4/2015 | Choi | H01G 2/06 361/304 |
| 2016/0189867 A1* | 6/2016 | Zaima | H01G 4/30 361/301.4 |
| 2016/0240319 A1* | 8/2016 | Onoue | H01G 4/35 |
| 2017/0345562 A1* | 11/2017 | Shimada | H01G 4/005 |
| 2017/0345565 A1* | 11/2017 | Usui | H01G 4/005 |
| 2017/0345566 A1* | 11/2017 | Tanaka | H01G 4/005 |

FOREIGN PATENT DOCUMENTS

| | | | |
|---|---|---|---|
| JP | 2001057311 A * | 2/2001 | ......... H01F 17/0013 |
| JP | 2001-102243 A | 4/2001 | |
| JP | 2001-155962 A | 6/2001 | |
| JP | 2002367852 A * | 12/2002 | |
| JP | 2012028503 A * | 2/2012 | |
| JP | 2012-114457 A | 6/2012 | |
| JP | 2014-112647 A | 6/2014 | |

OTHER PUBLICATIONS

Usui, "Ceramic Capacitor," U.S. Appl. No. 15/608,149, filed May 30, 2017.

Usui, "Ceramic Capacitor," U.S. Appl. No. 15/607,763, filed May 30, 2017.

Tanaka, "Ceramic Capacitor," U.S. Appl. No. 15/607,767, filed May 30, 2017.

* cited by examiner

CERAMIC CAPACITOR INCLUDING FIRST, SECOND, AND THIRD EXTERNAL ELECTRODES WRAPPING AROUND SIDE AND PRINCIPAL SURFACES

CROSS REFERENCE TO RELATED APPLICATIONS

This application claims the benefit of priority to Japanese Patent Application No. 2016-108586 filed on May 31, 2016. The entire contents of this application are hereby incorporated herein by reference.

BACKGROUND OF THE INVENTION

1. Field of the Invention

The present invention relates to a ceramic capacitor.

2. Description of the Related Art

In recent years, information terminal devices such as cellular phones and portable music players have been progressively reduced in size and made thinner. Accordingly, substrates to be mounted in electronic devices and electronic components to be mounted on substrates have been also progressively reduced in size. Electronic components to be mounted on substrates have been also progressively mounted at higher density. In order to achieve further reduction in size for electronic components, built-in electronic component substrates with electronic components embedded in the substrates have been also developed (for example, Japanese Patent Application Laid-Open No. 2012-114457). In the case of the built-in electronic component substrates, there is a need to ensure that wirings formed on the substrates and the embedded electronic components are electrically connected.

In addition, with increases in the amount of information in electronic devices, electronic devices have been more frequently used in higher frequency areas. Therefore, electronic components built in the built-in electronic component substrates have been requested to have equivalent series inductance (ESL) have lowered, thus allowing for use in high frequency areas.

For example, Japanese Patent Application Laid-Open No. 2001-155962 and Japanese Patent Application Laid-Open No. 2001-102243 propose multi-terminal capacitors such as three-terminal capacitors, as a means for achieving lower ESL of ceramic capacitors. However, the multi-terminal capacitors disclosed in Japanese Patent Application Laid-Open No. 2001-155962 and Japanese Patent Application Laid-Open No. 2001-102243 fail to consider embedding into substrates and electrical connections to wirings formed on substrates. For this reason, it is difficult to embed, in a preferred manner, the multi-terminal capacitors disclosed in Japanese Patent Application Laid-Open No. 2001-155962 and Japanese Patent Application Laid-Open No. 2001-102243 into substrates. In other words, the multi-terminal capacitors disclosed in Japanese Patent Application Laid-Open No. 2001-155962 and Japanese Patent Application Laid-Open No. 2001-102243 are not suitable for embedding into substrates.

Therefore, ceramic capacitors have been required which are low in ESL, and suitable for embedding into substrates.

In addition, in the case of ceramic capacitors able to be embedded into substrates, there is demand for improving reliability of connections between via hole electrodes and external electrodes of ceramic capacitors.

In addition, ceramic capacitors built into substrates typically have the problem of low adhesion to the substrates. The low adhesion force between the ceramic capacitors and the substrates has the possibility of separating the ceramic capacitors and the resins constituting the substrates from each other, thus degrading reliability of the ceramic capacitors due to ingress of water from the separated portions into the substrates, or fracturing connections between via hole electrodes and external electrodes of the ceramic capacitors.

SUMMARY OF THE INVENTION

Preferred embodiments of the present invention provide ceramic capacitors that are low ESL and suitable to be built into a substrate.

A ceramic capacitor according to a preferred embodiment of the present invention includes a capacitor main body, a plurality of internal electrodes, and external electrodes. The capacitor main body includes first and second principal surfaces, first and second side surfaces, and first and second end surfaces. The first and second principal surfaces extend in a length direction and a width direction. The width direction is perpendicular or substantially perpendicular to the length direction. The first and second side surfaces extend in the length direction and a laminating direction. The laminating direction is perpendicular or substantially perpendicular to each of the length direction and the width direction. The first and second end surfaces extend in the width direction and the laminating direction. The plurality of internal electrodes are disposed in the capacitor main body. The plurality of internal electrodes are exposed at each of the first and second side surfaces. The plurality of external electrodes cover an exposed portion of the internal electrode at the first side surface and an exposed portion of the internal electrode at the second side surface, to the first and second principal surfaces. The plurality of internal electrodes include a first internal electrode and a second internal electrode. The second internal electrode is opposed to the first internal electrode in the laminating direction. The first internal electrode includes a first opposed portion, first and second extended portions, and third and fourth extended portions. The first opposed portion is opposed to the second internal electrode. The first and second extended portions are connected to the first opposed portion. The first and second extended portions are each extended to the first side surface. The third and fourth extended portions are connected to the first opposed portion. The third and fourth extended portions are each extended to the second side surface. The second internal electrode includes a fifth extended portion and a sixth extended portion. The second opposed portion is opposed to the first opposed portion. The fifth extended portion is connected to the second opposed portion. The fifth extended portion is extended to the first side surface. The sixth extended portion is connected to the second opposed portion. The sixth extended portion is extended to the second side surface. The plurality of external electrodes include a first external electrode, a second external electrode, and a third external electrode. The first external electrode covers an exposed portion of the first extended portion at the first side surface and an exposed portion of the third extended portion at the second side surface, and wraps around the first side surface, the first principal surface, the second side surface, and the second principal surface. The second external electrode covers an exposed portion of the second extended portion at the first side surface and an exposed portion of the fourth extended portion at the second side surface, and wraps around the first side surface, the first principal surface, the second side surface, and the second principal surface. The third external electrode covers an exposed portion of the fifth extended portion at the first side surface and an exposed portion of the sixth extended portion at the second side surface, and wraps around the first side surface, the first principal surface, the second side surface, and the second principal surface. In the length direction, the third external electrode is located between the first external electrode and the second external electrode. The first, second, and third external electrodes each include an outermost layer composed of a Cu plated layer. When the widths of portions of the third external electrode located on the first and second principal surfaces in the length direction are denoted by A, whereas the widths of portions of the third external electrode located on the first and second side surfaces in the length direction are denoted by B, the magnitude relationship of A>B is satisfied. When the widths of portions of the first and second external electrodes located on the first and second principal surfaces in the length direction are denoted by C, whereas the widths of portions of the first and second external electrodes located on the first and second side surfaces in the length direction are denoted by D, the magnitude relationship of C>D is satisfied.

In a ceramic capacitor according to a preferred embodiment of the present invention, when the widths of portions of the third external electrode located on the first and second principal surfaces in the length direction are denoted by A, whereas the widths of portions of the third external electrode located on the first and second side surfaces in the length direction are denoted by B, the magnitude relationship of A>B is satisfied. In addition, when the widths of portions of the first and second external electrodes located on the first and second principal surfaces in the length direction are denoted by C, whereas the widths of portions of the first and second external electrodes located on the first and second side surfaces in the length direction are denoted by D, the magnitude relationship of C>D is satisfied. For this reason, when a ceramic capacitor according to a preferred embodiment of the present invention is built in a substrate, there are favorable connection to via hole electrodes, and peeling between the substrate and the ceramic capacitor is less likely to be caused. Accordingly, a ceramic capacitor according to a preferred embodiment of the present invention is easy to be built into a substrate.

In addition, a ceramic capacitor according to a preferred embodiment of the present invention is configured such that the extended portions of the first and second internal electrodes are all extended to the first and second side surfaces of the capacitor main body, thus making it possible to reduce the interval between the extended portion of the first internal electrode and the extended portion of the second internal electrode. For this reason, the path length of a current flow is able to be reduced in the ceramic capacitor. Accordingly, a ceramic capacitor according to a preferred embodiment of the present invention includes low equivalent series inductance (ESL).

In a ceramic capacitor according to a preferred embodiment of the present invention, the ratio B/A is preferably about 0.77 or more and about 0.96 or less.

In a ceramic capacitor according to a preferred embodiment of the present invention, the ratio D/C is preferably about 0.78 or more and about 0.96 or less.

In a ceramic capacitor according to a preferred embodiment of the present invention, the first external electrode preferably includes a first portion extending from a portion located on the first principal surface to a portion of the first end surface; a second portion extending from a portion located on the second principal surface to a portion of the first end surface; a third portion extending from a portion located on the first side surface to a portion of the first end surface; and a fourth portion extending from a portion located on the second side surface to a portion of the first end surface, whereas the second external electrode preferably includes a fifth portion extending from a portion located on the first principal surface to a portion of the second end surface; a sixth portion extending from a portion located on the second principal surface to a portion of the second end surface; a seventh portion extending from a portion located on the first side surface to a portion of the second end surface; and an eighth portion extending from a portion located on the second side surface to a portion of the second end surface, and the first end surface preferably includes a central portion exposed from the first external electrode, whereas the second end surface preferably includes a central portion exposed from the second external electrode.

In a ceramic capacitor according to a preferred embodiment of the present invention, the lengths of the first and second portions, and of the fifth and sixth portions in the laminating direction are each preferably about 5% or more and about 15% or less of the dimension of the ceramic capacitor in the laminating direction, and the lengths of the third and fourth portions, and of the seventh and eighth portions in the laminating direction are each preferably about 5% or more and about 15% or less of the width dimension of the ceramic capacitor.

In a ceramic capacitor according to a preferred embodiment of the present invention, respective lengths of the first, second, fifth, and sixth portions in the laminating direction are preferably smaller than lengths of the third, fourth, seventh, and eighth portions in the width direction.

According to various preferred embodiments of the present invention, ceramic capacitors are low in ESL and suitable to be built into a substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
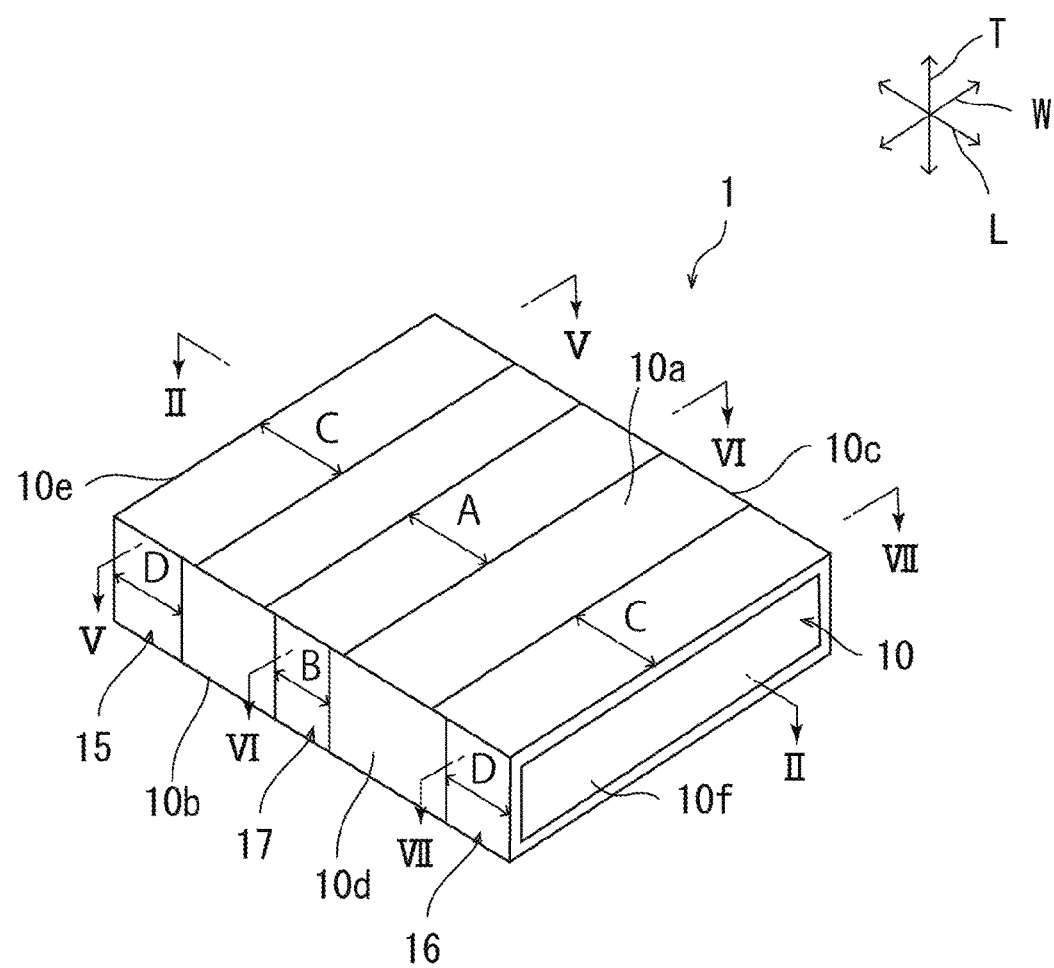
FIG. 1 is a schematic perspective view of a capacitor according to a preferred embodiment of the present invention.

Examples of preferred embodiments of the present invention will be described below. However, the following preferred embodiments are examples only. The present invention is not limited to the following preferred embodiments in any way.

In addition, members that have substantially the same functions shall be denoted by the same reference symbols in the respective drawings referred to in the description of preferred embodiments and the like. In addition, the drawings referred to in the description of preferred embodiments and the like are made in a schematic manner. The dimensional ratios and the like of objects presented in the drawings may differ from the dimensional ratios and the like of real objects. The dimensional ratios and the like of objects may also differ between the drawings. The dimensional ratios and the like of specific objects should be determined in view of the following description.

Figure 2:
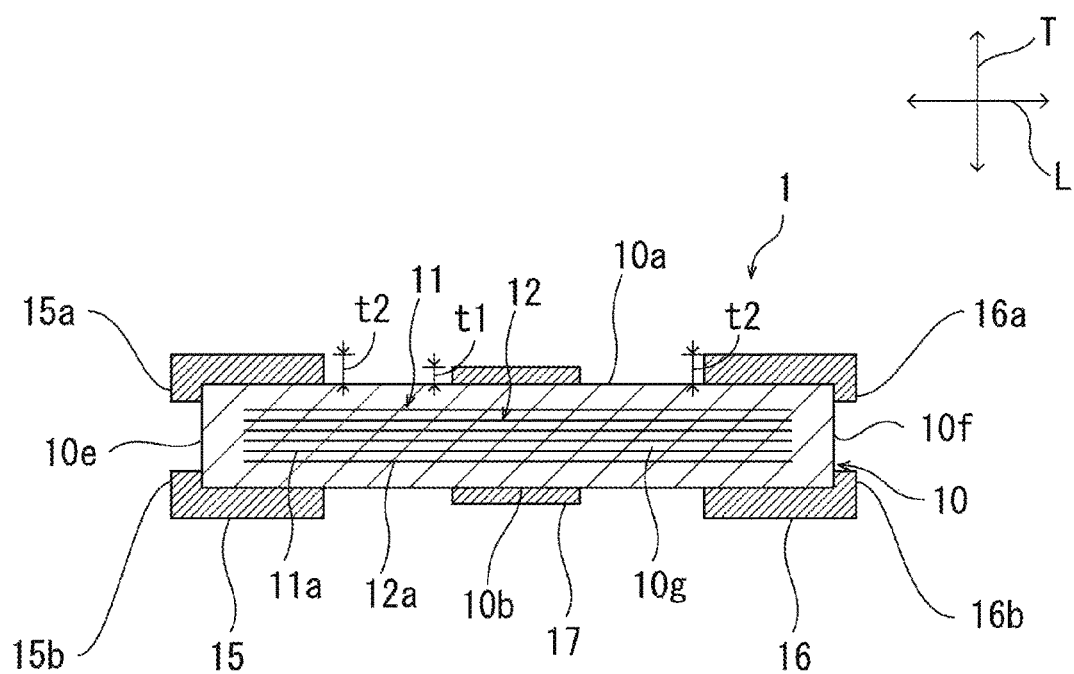
FIG. 2 is a schematic cross-sectional view of FIG. 1 along the line II-II.
Figure 3:
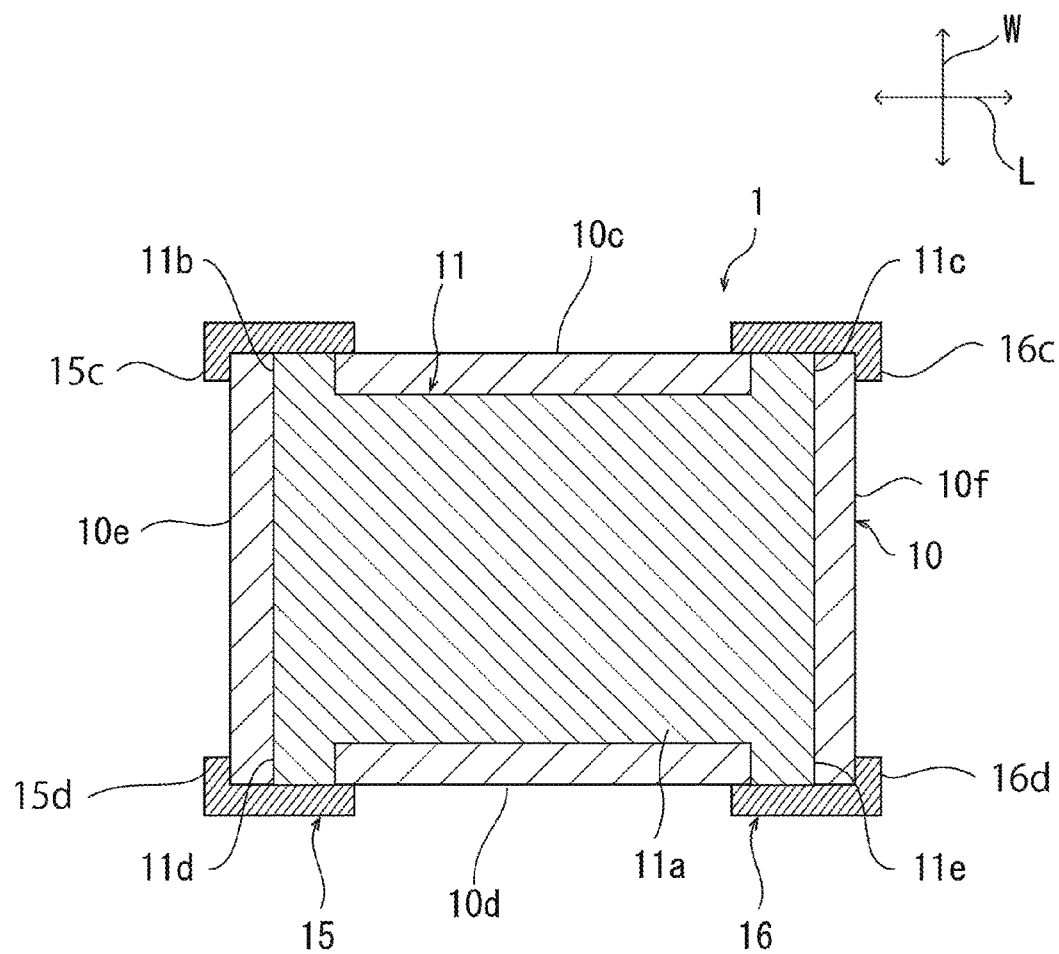
FIG. 3 is a schematic cross-sectional view of a capacitor according to a first preferred embodiment of the present invention.
Figure 4:
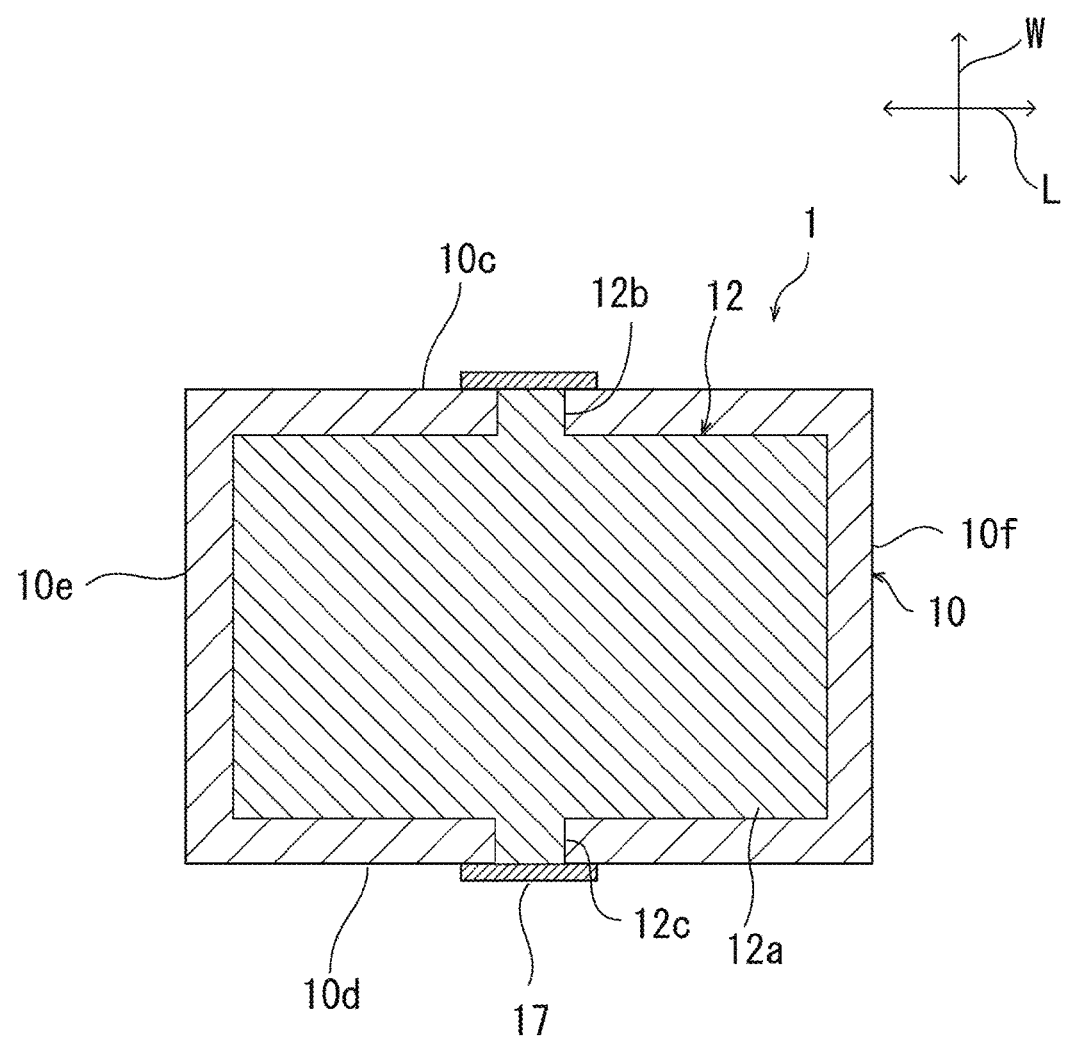
FIG. 4 is a schematic cross-sectional view of the capacitor according to the first preferred embodiment of the present invention.
Figure 5:
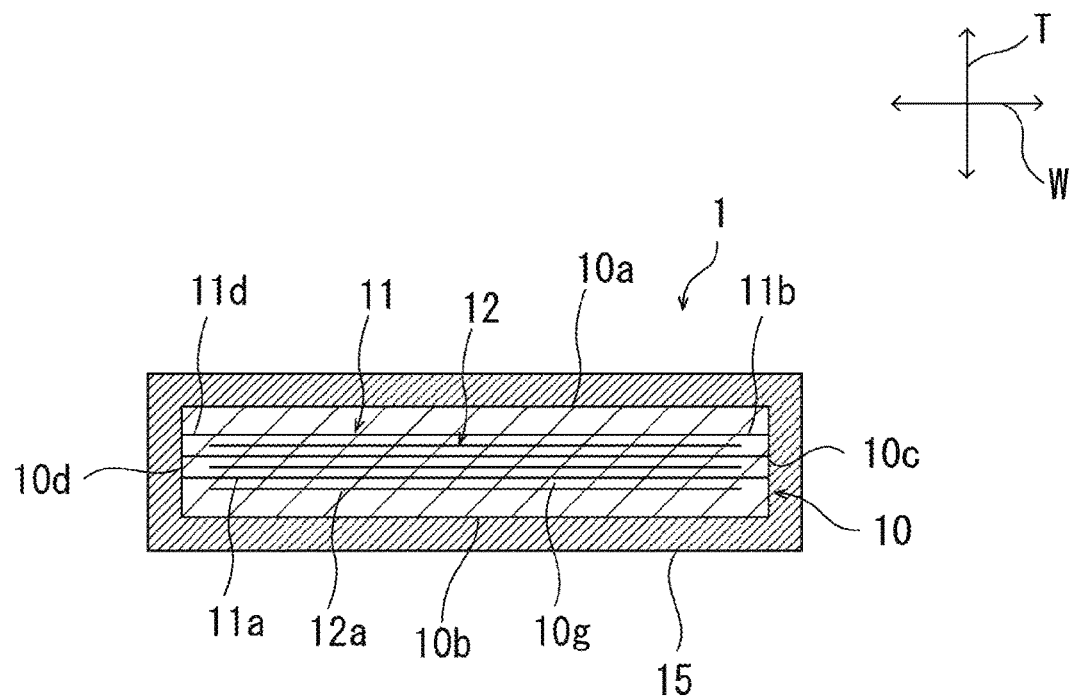
FIG. 5 is a schematic cross-sectional view of FIG. 1 along the line V-V.
Figure 6:
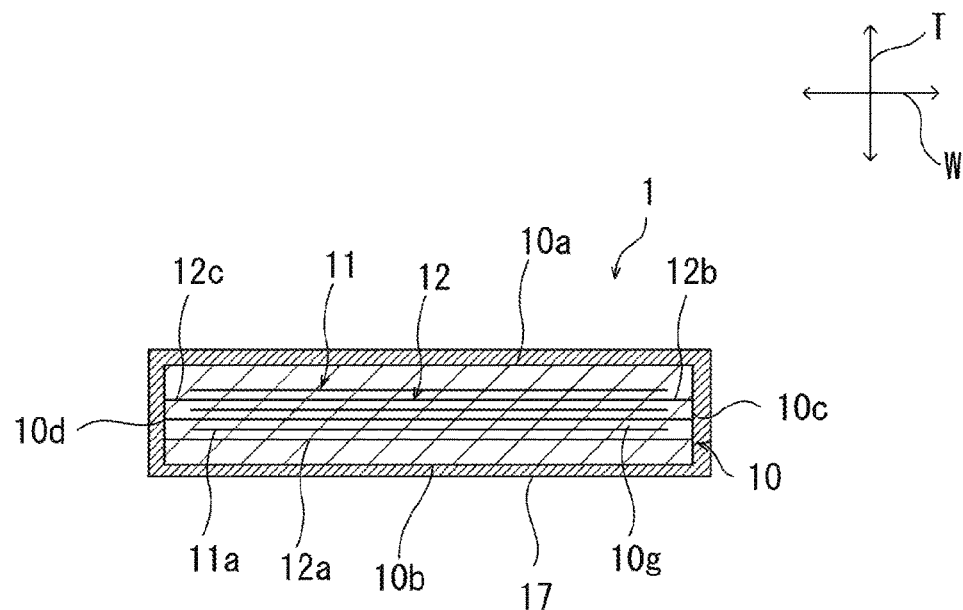
FIG. 6 is a schematic cross-sectional view of FIG. 1 along the line VI-VI.
Figure 7:
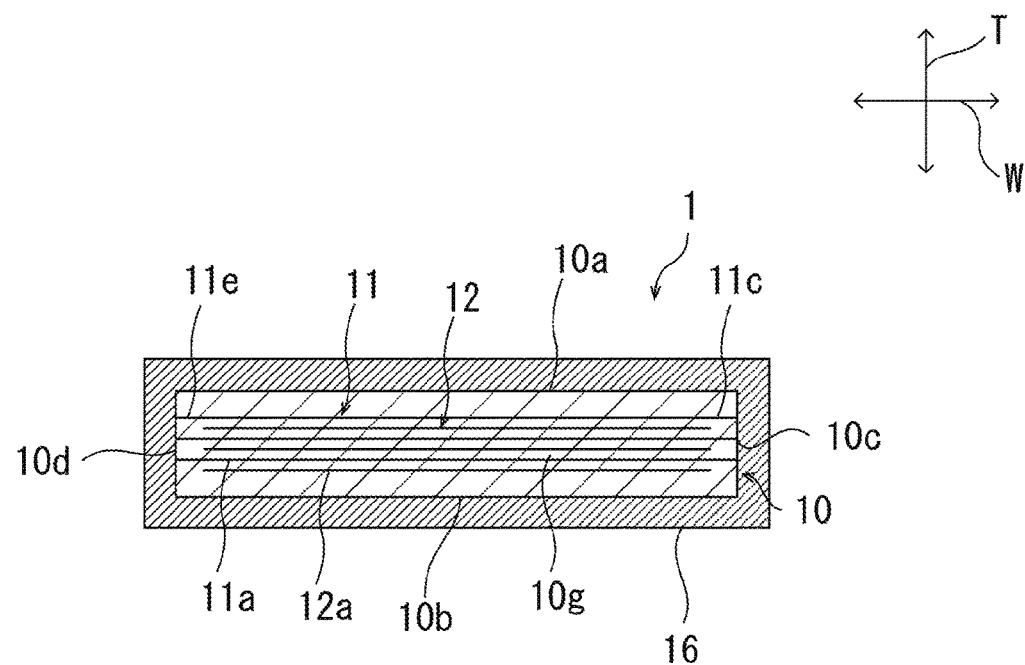
FIG. 7 is a schematic cross-sectional view of FIG. 1 along the line VII-VII.
Figure 8:
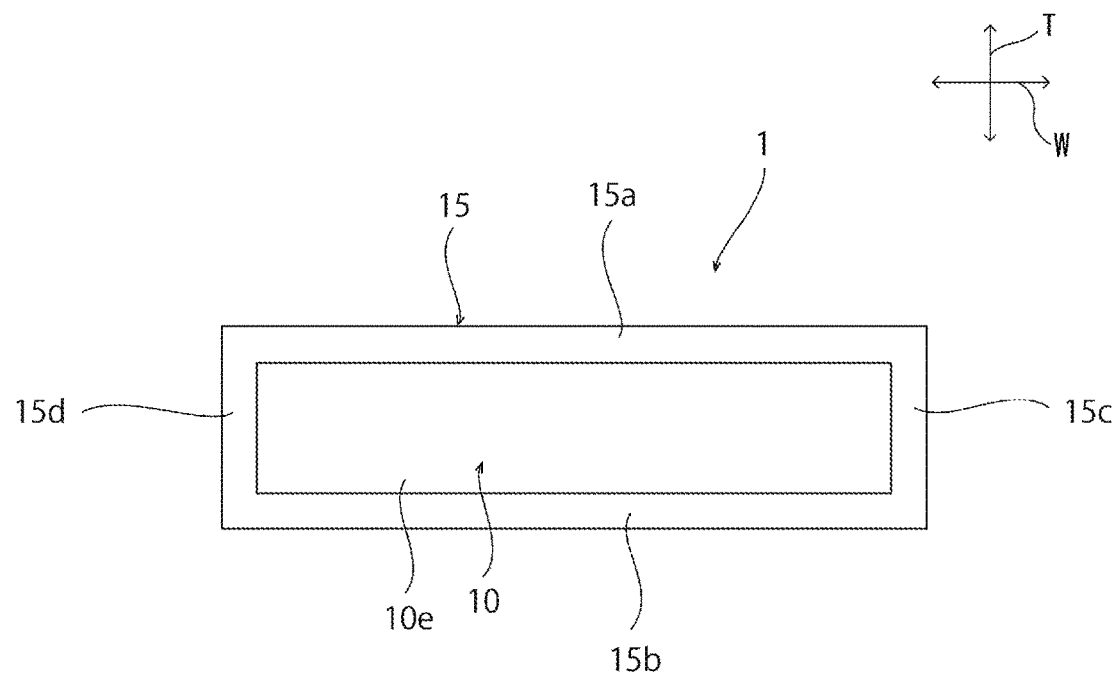
FIG. 8 is a schematic plan view of a first end surface of a capacitor according to a preferred embodiment of the present invention.
Figure 9:
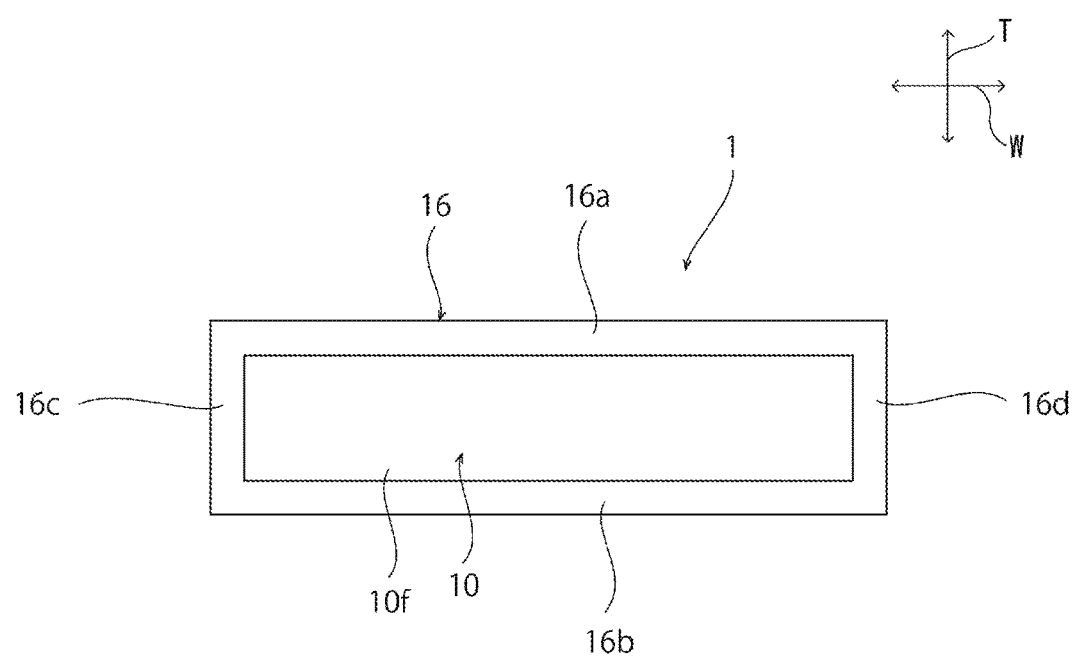
FIG. 9 is a schematic plan view of a second end surface of a capacitor according to a preferred embodiment of the present invention.

FIG. 1 is a schematic perspective view of a capacitor according to a first preferred embodiment. FIG. 2 is a schematic cross-sectional view of FIG. 1 along the line II-II. FIG. 3 is a schematic cross-sectional view of a capacitor according to the first preferred embodiment in a length direction L and a width direction W. FIG. 4 is a schematic cross-sectional view of the capacitor according to the first preferred embodiment in the length direction L and the width direction W. It is to be noted that FIGS. 3 and 4 are schematic cross-sectional views of different sites that differ in the laminating direction T. FIG. 5 is a schematic cross-sectional view of FIG. 1 along the line V-V. FIG. 6 is a schematic cross-sectional view of FIG. 1 along the line VI-VI. FIG. 7 is a schematic cross-sectional view of FIG. 1 along the line VII-VII. FIG. 8 is a schematic plan view of a first end surface of the capacitor according to the present preferred embodiment. FIG. 9 is a schematic plan view of a second end surface of the capacitor according to the present preferred embodiment.

As shown in FIGS. 1 to 7, the ceramic capacitor 1 includes a capacitor main body 10. The capacitor main body 10 preferably has a cuboid or substantially cuboid shape. The capacitor main body 10 includes first and second principal surfaces 10a, 10b, first and second side surfaces 10c, 10d, and first and second end surfaces 10e, 10f. The first and second principal surfaces 10a, 10b each extend in the length direction L and the width direction W. The length direction L refers to a direction of connecting the first end surface 10e and the second end surface 10f. The width direction W is perpendicular or substantially perpendicular to the length direction L. The width direction W refers to a direction of connection the first side surface 10c and the second side surface 10d. The first and second side surfaces 10c, 10d each extend in the length direction L and the laminating direction T. The laminating direction T refers to a direction of connecting the first principal surface 10a and the second principal surface 10b. The laminating direction T is perpendicular or substantially perpendicular to each of the length direction L and the width direction W. The first and second end surfaces 10e, 10f each extend in the width direction W and the laminating direction T. The capacitor main body 10 may include ridges and corners chamfered or rounded, but preferably includes a rounded shape from the perspective of preventing the generation of cracks.

The capacitor main body 10 can be made of, for example, an appropriate dielectric ceramic. The capacitor main body 10 may be specifically composed of, for example, a dielectric ceramic containing $BaTiO_3$, $CaTiO_3$, $SrTiO_3$, $CaZrO_3$, or the like. The capacitor main body 10 may have a Mn compound, an Fe compound, a Cr compound, a Co compound, a Ni compound, and the like added thereto.

The dimensions of the capacitor main body 10 are not particularly limited, but when the height dimension, length dimension, and width dimension of the capacitor main body 10 are denoted respectively by DT, DL, and DW, it is preferable to satisfy the condition of DT<DW<DL, (about ⅐)DW≤DT≤(about ⅓)DW, or DT<about 0.25 mm. Specifically, it is preferable to meet the conditions of about 0.05 mm≤DT<about 0.25 mm, about 0.4 mm≤DL≤about 1 mm, and about 0.3 mm≤DW≤about 0.5 mm, for example. As just described, the ceramic capacitor 1 according to the present preferred embodiment is small in dimension in the laminating direction, and thus suitable to be built into a substrate. However, when the ceramic capacitor 1 is excessively small in dimension in the laminating direction, the capacitance of the ceramic capacitor 1 may be excessively low, or the strength of the ceramic capacitor 1 may be excessively low. Accordingly, the dimension of the ceramic capacitor 1 in the laminating direction is preferably about ⅕ times or more, more preferably about ½ times or more as large as the width dimension, for example.

It is to be noted that the respective dimensions of the ceramic capacitor 1 can be measured with the use of a micrometer or a microscope.

As shown in FIG. 2, a plurality of internal electrodes 11, 12 are provided inside the capacitor main body 10. Specifically, inside the capacitor main body 10, a plurality of first internal electrodes 11 and a plurality of second internal electrodes 12 are disposed alternately in the laminating direction T. The first internal electrode 11 and the second internal electrode 12 adjacent to each other in the laminating direction T are opposed with a ceramic portion 10g interposed therebetween. Thus, capacitance is generated. It is to be noted that the ceramic portion 10g is preferably, for example, about 0.5 μm or more and about 10 μm or less in thickness.

As shown in FIG. 3, the first internal electrode 11 is exposed at each of the first side surface 10c and the second side surface 10d. Specifically, the first internal electrode 11 includes an opposed portion 11a, a first extended portion 11b, a second extended portion 11c, a third extended portion 11d, and a fourth extended portion 11e.

The opposed portion 11a is opposed to the second internal electrode 12 in the laminating direction T. The opposed portion 11a preferably has a rectangular or substantially rectangular shape.

The first extended portion 11b is connected to the opposed portion 11a. The first extended portion 11b is extended to the first side surface 10c. Specifically, the first extended portion 11b extends from corners of the opposed portion 11a closer to the first side surface 10c and the first end surface 10e toward the first side surface 10c.

The second extended portion 11c is connected to the opposed portion 11a. The second extended portion 11c is extended to the first side surface 10c. Specifically, the second extended portion 11c extends from corners of the opposed portion 11a closer to the first side surface 10c and the second end surface 10f toward the first side surface 10c. The first extended portion 11b is connected to one end of the opposed portion 11a in the length direction L, whereas the second extended portion 11c is connected to the other end of the opposed portion 11a in the length direction L.

The third extended portion 11d is connected to the opposed portion 11a. The third extended portion 11d is extended to the second side surface 10d. Specifically, the third extended portion 11d extends from corners of the opposed portion 11a closer to the second side surface 10d and the first end surface 10e toward the second side surface 10d.

The fourth extended portion 11e is connected to the opposed portion 11a. The fourth extended portion 11e is extended to the second side surface 10d. Specifically, the fourth extended portion 11e extends from corners of the opposed portion 11a closer to the second side surface 10d and the second end surface 10f toward the second side surface 10d. The third extended portion 11d is connected to one end of the opposed portion 11a in the length direction L, whereas the fourth extended portion 11e is connected to the other end of the opposed portion 11a in the length direction L.

As shown in FIG. 4, the second internal electrode 12 is exposed at each of the first and second side surfaces 10c, 10d. Specifically, the second internal electrode 12 includes an opposed portion 12a, a fifth extended portion 12b, and a sixth extended portion 12c.

The opposed portion 12a is opposed to the opposed portion 11a of the first internal electrode 11 in the laminating direction T. The opposed portion 12a preferably has a rectangular or substantially rectangular shape.

The fifth extended portion 12b is connected to the opposed portion 12a. The fifth extended portion 12b is extended to the first side surface 10c. The fifth extended portion 12b is located between the first extended portion 11b and the second extended portion 11c in the length direction L. The fifth extended portion 12b extends substantially from the center of the opposed portion 12a toward the first side surface 10c in the length direction L.

The sixth extended portion 12c is connected to the opposed portion 12a. The sixth extended portion 12c is extended to the second side surface 10d. The sixth extended portion 12c is located between the third extended portion 11d and the fourth extended portion 11e in the length direction L. The sixth extended portion 12c extends substantially from the center of the opposed portion 12a toward the second side surface 10d in the length direction L.

It is to be noted that the extended portions 11b, 11c, 11d, 11e, 12b, 12c can be each, for example, about 50 μm or more and about 100 μm or less in width.

As described above, the extended portions 11b, 11c, 11d, 11e, 12b, 12c of the internal electrodes 11, 12 are all configured to be extended to the first and second side surfaces of the capacitor main body 10, thus making it possible to reduce the respective intervals between the extended portions 11b, 11c, 11d, 11e, of the first internal electrode 11 and the extended portions 12b, 12c of the second internal electrode 12. For this reason, the path length of a current flow is able to be reduced in the ceramic capacitor 1. Accordingly, the equivalent series inductance (ESL) of the ceramic capacitor 1 is able to be reduced.

The first and second internal electrodes 11, 12 can be, for example, about 0.2 μm or more and about 2 μm or less in thickness.

The first and second internal electrodes 11, 12 maybe made of appropriate conductive materials. The first and second internal electrodes may be made of, for example, metals such as Ni, Cu, Ag, Pd, and Au, and alloys containing one of these metals, such as Ag—Pd alloys.

As shown in FIG. 1, the ceramic capacitor 1 includes a plurality of external electrodes 15, 16, and 17. Specifically, the ceramic capacitor 1 includes the first external electrode 15, the second external electrode 16, and the third external electrode 17.

The first external electrode 15 covers an exposed portion of the first extended portion 11b of the first internal electrode 11 at the first side surface 10c and an exposed portion of the third extended portion 11d of the first internal electrode 11 at the second side surface 10d, to the first and second principal surfaces 10a, 10b. Specifically, the first external electrode 15 covers the exposed portions of the first extended portion 11b and third extended portion 11d, and wraps around the first side surface 10c, the first principal surface 10a, the second side 10d, and second principal surface 10b. The first external electrode 15 is preferably about 190 μm or more and about 270 μm or less in width.

The second external electrode 16 covers an exposed portion of the second extended portion 11c of the first internal electrode 11 at the first side surface 10c and an exposed portion of the fourth extended portion 11e of the first internal electrode 11 at the second side surface 10d, to the first and second principal surfaces 10a, 10b. Specifically, the second external electrode 16 covers the exposed portions of the second extended portion 11c and fourth extended portion 11e, and wraps around the first side surface 10c, the first principal surface 10a, the second side 10d, and second principal surface 10b. The second external electrode 16 is preferably about 190 μm or more and about 270 μm or less in width.

The first external electrode 15 is provided on one end of the capacitor main body 10 in the length direction L, whereas the second external electrode 16 is provided on the other end of the capacitor main body 10 in the length direction L.

In the length direction L, the third external electrode 17 is provided between the first external electrode 15 and the second external electrode 16. The third external electrode 17 covers an exposed portion of the fifth extended portion 12b of the second internal electrode 12 at the first side surface 10c and an exposed portion of the sixth extended portion 12c of the second internal electrode 12 at the second side surface 10d, to the first and second principal surfaces 10a, 10b. Specifically, the third external electrode 17 covers the exposed portions of the fifth extended portion 12b and sixth extended portion 12c, and wraps around the first side surface 10c, the first principal surface 10a, the second side surface 10d, and second principal surface 10b. The third external electrode 17 is preferably about 240 μm or more and about 320 μm or less in width, for example. The distance in the length direction L between the third external electrode 17 and the first or second external electrode 15, 16 is preferably about 70 μm or more, for example.

Figure 11:
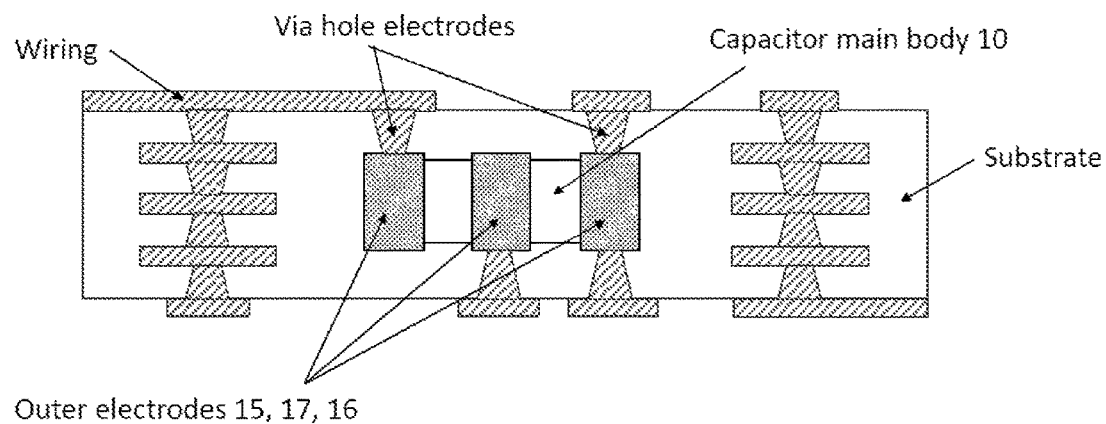
FIG. 11 is a schematic perspective view of a capacitor embedded in a substrate according to a preferred embodiment of the present invention.

As described above, the first to third external electrodes 15 to 17 each wrap around the capacitor main body 10, and thus, the areas of the external electrodes 15 to 17 are able to be ensured sufficiently, and via holes are able to be formed easily which lead to the external electrodes 15 to 17 of the ceramic capacitor 1 embedded in a substrate, as shown in FIG. 11. In addition, it becomes possible to make a plurality of via hole electrodes electrically continuous to each of the external electrodes 15 to 17, and the wiring resistance from the substrate side to the ceramic capacitor 1 is thus reduced. Accordingly, it becomes possible to achieve further lowered ESL.

The first to third external electrodes 15 to 17 each include an outermost layer composed of a Cu plated layer.

Figure 12:
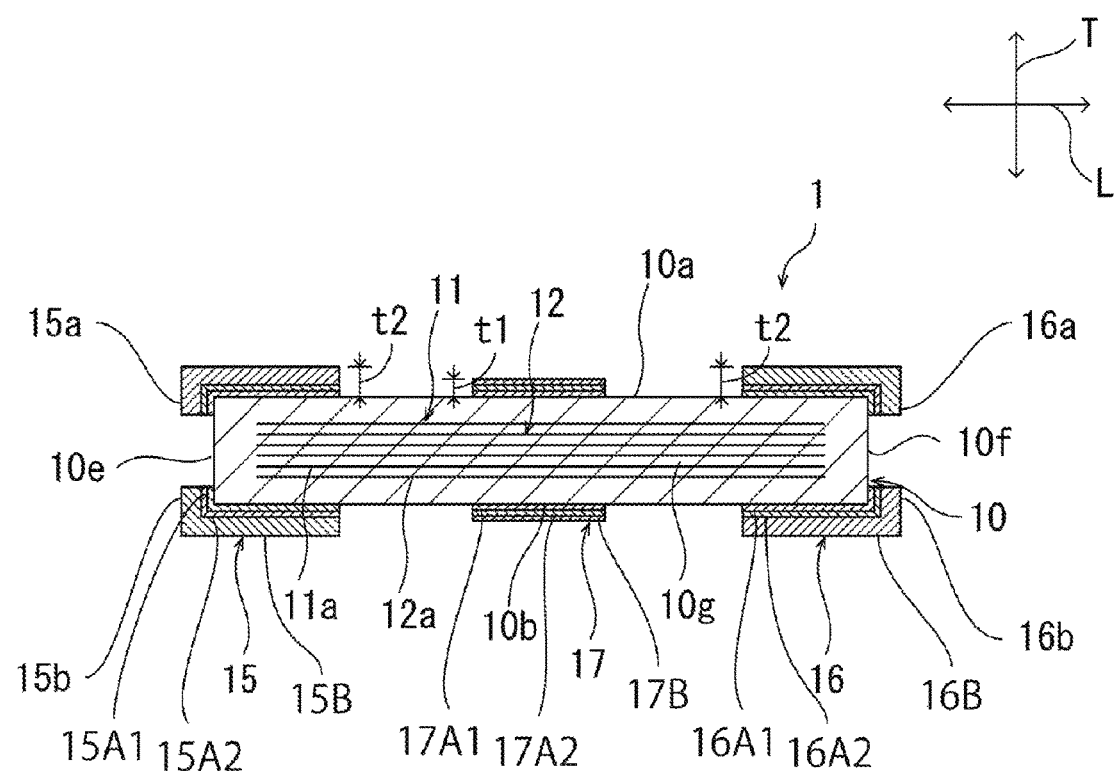
FIG. 12 is a schematic cross-sectional view of a capacitor according to another preferred embodiment of the present invention.

The first to third external electrodes 15 to 17 may each include, for example, a laminated body of a base electrode layer 15A1, 16A1, 17A1, a thin-film electrode layer 15A2, 16A2, 17A2, and a Cu plated layer 15B, 16B, 17B, respectively, as shown in FIG. 12.

The base electrode layer preferably includes at least one metal selected from the group consisting of, for example, Cu, Ni, Ag, Pd, an Ag—Pd alloy, and Au. The base electrode layer may be obtained by co-firing with the capacitor main body 10 including the internal electrodes 11, 12, or applying and baking a conductive paste after the capacitor main body 10 including the internal electrodes 11, 12 is subjected to firing. Alternatively, the base electrode layer may be formed by plating, or formed by curing a conductive resin including a thermosetting resin. The base electrode layer preferably further includes an inorganic binding material. The inorganic binding material increases the adhesion strength to the capacitor main body 10. When the base electrode layer is formed by co-firing with the capacitor main body 10 including the internal electrodes 11, 12, the inorganic binding material is also referred to as a common material. In such a case, the inorganic binding material is preferably, for example, the same type of ceramic material as the ceramic material included in the capacitor main body 10. The inorganic binding material may be, for example, a ceramic material containing the same main constituent as that of the ceramic material included in the capacitor main body 10. Alternatively, the inorganic binding material of the base electrode layer may be, for example, a glass component.

The base electrode layer is provided on the exposed portions of the internal electrodes 11, 12 at the first and second side surfaces 10c, 10d of the capacitor main body 10. The base electrode layer may extend not only on the exposed portions of the internal electrodes 11, 12 on the first and second side surfaces 10c, 10d, but also to ridges where the first and second principal surfaces 10a, 10b of the capacitor main body 10 intersect the first and second side surfaces 10c, 10d thereof, and may be provided partially on the principal surfaces 10a, 10b of the capacitor main body 10. According to the present preferred embodiment, the first external electrode 15 and the second external electrode 16 are not disposed on ridges where the first and second principal surfaces 10a, 10b intersect the first and second end surfaces 10e, 10f, or on the first and second end surfaces 10e, 10f. For this reason, the capacitor main body 10 which includes a high adhesion force to a resin of a substrate is able to be increased in surface area. Accordingly, the adhesion between the substrate and the ceramic capacitor 1 is improved.

The maximum thickness of the base electrode layer is preferably about 1 μm or more, for example.

According to the present preferred embodiment, the thin-film electrode layer is provided on the base electrode layer and the first and second principal surfaces 10a, 10b. The thin-film electrode layer preferably includes at least one metal selected from the group consisting of, for example, Mg, Al, Ti, W, Cr, Cu, Ni, Ag, Co, Mo, and V. In this case, the fixing strength of the external electrodes 15 to 17 to the capacitor main body 10 is able to be increased. The thin-film electrode layer is preferably about 0.05 μm or more and about 1 μm or less in thickness, for example. The thin-film electrode layer may be a single layer, or a laminated body of a plurality of layers. The thin-film electrode layer can be formed by, for example, a sputtering method or the like. In other words, the thin-film electrode layer may include a sputtering film.

The Cu plated layer covers the base electrode layer and the thin-film electrode layer. The plated layer may include a single layer or a plurality of layers, and the outermost layer preferably is the Cu plated layer. The outermost layer of the plated layer is the Cu plated layer, thus making it possible to build the ceramic capacitor 1 easily in a substrate to embed the ceramic capacitor 1 into the substrate. In this regard, to embed the ceramic capacitor 1 into a substrate, via holes for electronic component connection are preferably provided in order to make the capacitor electrically continuous to the external electrodes 15 to 17, and the via holes for electronic component connection are preferably formed with the use of a laser such as a $CO_2$ laser, for example. In the case of forming via holes with the use of a laser, the external electrodes 15 to 17 of the ceramic capacitor 1 will be irradiated directly with the laser. In this case, the outermost layers of the external electrodes 15 to 17 include the Cu plated film, thus making it possible to reflect the laser at a high reflectivity. Accordingly, the ceramic capacitor 1 where the outermost layers of the plated layers include the Cu plated layers can be used as a substrate-embedded type capacitor in a preferred manner. If the reflectivity of the external electrodes 15 to 17 is low with respect to the laser, the laser may go into the capacitor, thus damaging the capacitor.

The plated film is preferably about 1 μm or more and about 15 μm or less in thickness per layer, for example. Conductive resin layers for stress relaxation may be provided between the base electrode layers and the plated layers.

As shown in FIG. 2, according to the present preferred embodiment, the thickness t1 of a portion of the third external electrode 17 provided on the first or second principal surface 10a, 10b is smaller than the thicknesses t2 of portions of the first and second external electrodes 15, 16 provided on the first or second principal surface 10a, 10b. For this reason, in mounting the ceramic capacitor 1 onto a substrate, a mount nozzle of a surface mount machine is able to be prevented from coming into abutment with only the third external electrode 17, and is also brought into abutment with the first and second external electrodes 15, 16. For this reason, stress generated in adsorption with the mount nozzle is able to be dispersed. Accordingly, the capacitor main body 10 is able to be prevented from having cracks and the like generated with ends of the external electrodes 15 to 17 as starting points. More specifically, the reliability of the ceramic capacitor 1 is able to be improved.

From the perspective of preventing the capacitor main body 10 in a more effective manner from having cracks and the like generated with ends of the external electrodes 15 to 17 as starting points, the difference is preferably about 0.5 μm or more, for example, between the thickness t1 of a portion of the third external electrode 17 provided on the first or second principal surface 10a, 10b and the thicknesses t2 of portions of the first and second external electrodes 15, 16 provided on the first or second principal surface 10a, 10b.

As shown in FIGS. 2, 3, and 8, the first external electrode 15 extends over the first and second principal surfaces 10a, 10b and the first and second side surfaces 10c, 10d to a portion of the first end surface 10e. The first external electrode 15 includes a first portion 15a, a second portion 15b, a third portion 15c, and a fourth portion 15d.

The first portion 15a extends from a portion located on the first principal surface 10a to a portion of the first end surface 10e. For this reason, the first portion 15a covers a ridge of the capacitor main body 10, which is defined by the first principal surface 10a and the first end surface 10e.

The second portion 15b extends from a portion located on the second principal surface 10b to a portion of the first end surface 10e. For this reason, the second portion 15b covers a ridge of the capacitor main body 10, which is defined by the second principal surface 10b and the first end surface 10e. The second portion 15b is not directly connected to the first portion 15a. For this reason, the first end surface 10e is exposed between the first portion 15a and the second portion 15b.

The third portion 15c extends from a portion located on the first side surface 10c to a portion of the first end surface 10e. For this reason, the third portion 15c covers a ridge of the capacitor main body 10, which is defined by the first side surface 10c and the first end surface 10e.

The fourth portion 15d extends from a portion located on the second side surface 10d to a portion of the first end surface 10e. For this reason, the fourth portion 15d covers a ridge of the capacitor main body 10, which is defined by the second side surface 10d and the first end surface 10e. The fourth portion 15d is not directly connected to the third portion 15c. For this reason, the first end surface 10e is exposed between the third portion 15c and the fourth portion 15d.

As shown in FIGS. 2, 3, and 9, the second external electrode 16 extends over the first and second principal surfaces 10a, 10b and the first and second side surfaces 10c, 10d to a portion of the second end surface 10f. The second external electrode 16 includes a fifth portion 16a, a sixth portion 16b, a seventh portion 16c, and an eighth portion 16d.

The fifth portion 16a extends from a portion located on the first principal surface 10a to a portion of the second end surface 10f. For this reason, the fifth portion 16a covers a ridge of the capacitor main body 10, which is defined by the first principal surface 10a and the second end surface 10f.

The sixth portion 16b extends from a portion located on the second principal surface 10b to a portion of the second end surface 10f. For this reason, the sixth portion 16b covers a ridge of the capacitor main body 10, which is defined by the second principal surface 10b and the second end surface 10f. The sixth portion 16b is not directly connected to the fifth portion 16a. For this reason, the second end surface 10f is exposed between the fifth portion 16a and the sixth portion 16b.

The seventh portion 16c extends from a portion located on the first side surface 10c to a portion of the second end surface 10f. For this reason, the seventh portion 16c covers a ridge of the capacitor main body 10, which is defined by the first side surface 10c and the second end surface 10f.

The eighth portion 16d extends from a portion located on the second side surface 10d to a portion of the second end surface 10f. For this reason, the eighth portion 16d covers a ridge of the capacitor main body 10, which is defined by the second side surface 10d and the second end surface 10f. The eighth portion 16d is not directly connected to the seventh portion 16c. For this reason, the second end surface 10f is exposed between the seventh portion 16c and the eighth portion 16d.

As described above, the first to fourth portions 15a to 15d of the first external electrode 15 cover the ridges defined by the first end surface 10e of the capacitor main body 10 and each of the first and second principal surfaces 10a, 10b and first and second side surfaces 10c, 10d. The fifth to eighth portions 16a to 16d of the second external electrode 16 cover the ridges defined by the second end surface 10f of the capacitor main body 10 and each of the first and second principal surfaces 10a, 10b and first and second side surfaces 10c, 10d. Accordingly, the ridges of the capacitor main body 10 are protected with the first and second external electrodes 15, 16. Therefore, even when shocks and stress are applied to the ceramic capacitor 1 from the outside, the capacitor main body 10 is less likely to undergo breakdown. Accordingly, the ceramic capacitor 1 achieves excellent reliability.

According to various preferred embodiments of the present invention, there is not always a need for the first external electrode to cover the ridge defined by the first or second principal surface or the first or second side surface and the first end surface. There is not always a need for the first external electrode to be provided on the first end surface. There is not always a need for the second external electrode to cover the ridge defined by the first or second principal surface or the first or second side surface and the second end surface. There is not always a need for the second external electrode to be provided on the second end surface.

In the case of the ceramic capacitor 1, the first end surface 10e is not entirely covered with the first external electrode 15, whereas the second end surface 10f is not entirely covered with the second external electrode 16. The central portion of the first end surface 10e is exposed from the first external electrode 15, and the second end surface 10f is exposed from the second external electrode 16. More specifically, the first end surface 10e is exposed between the first portion 15a and the second portion 15b, and partially exposed between the third portion 15c and the fourth portion 15d. In addition, the second end surface 10f is exposed between the fifth portion 16a and the sixth portion 16b, and partially exposed between the seventh portion 16c and the eighth portion 16d. Therefore, the surface of capacitor main body 10 is able to be exposed which includes a higher adhesion force to a substrate than the surfaces of the external electrodes 15, 16. For this reason, when the ceramic capacitor 1 is built in a substrate, the adhesion strength between the ceramic capacitor 1 and the substrate can be increased. Accordingly, ingress of water and the like into the built-in capacitor substrate is prevented. Therefore, the ceramic capacitor 1 includes, even when built in a substrate, excellent reliability.

In the case of the ceramic capacitor 1, the lengths of the first and second portions 15a, 15b of the first external electrode 15, and of the fifth and sixth portions 16a, 16b of the second external electrode 16 in the laminating direction T are each about 5% or more and about 15% or less, for example, of the dimension of the ceramic capacitor 1 in the laminating direction T. The lengths of the third and fourth portions 15c, 15d of the first external electrode 15, and of the seventh and eighth portions 16c, 16d of the second external electrode 16 in the laminating direction T are each about 5% or more and about 15% or less, for example, of the width dimension of the ceramic capacitor 1. For this reason, the surface of the capacitor main body 10 which includes a higher adhesion force to the substrate than the surfaces of the external electrodes 15, 16 is able to be exposed in an optimum range. Therefore, when the ceramic capacitor 1 is built into a substrate, the adhesion thereof to the substrate is able to be improved. In addition, the ridges of the capacitor main body 10 are protected with the external electrodes 15, 16, and the ceramic capacitor 1 is thus less likely to be broken or cracked. Additionally, the lengths of the third and fourth portions 15c, 15d of the first external electrode 15, and of the seventh and eighth portions 16c, 16d of the second external electrode 16 are adapted to fall within the appropriate range, thus making also it possible to control the dimensions of the external electrodes in the length direction of the ceramic capacitor 1. For this reason, the ceramic capacitor 1 is unlikely to be defectively inserted into a cavity of a substrate on which the capacitor is to be mounted, and errors are unlikely to be caused in mounting the ceramic capacitor 1.

In the ceramic capacitor 1, the lengths of the first and second portions 15a, 15b of the first external electrode 15, and of the fifth and sixth portions 16a, 16b of the second external electrode 16 in the laminating direction T are each more preferably about 8% or more and about 12% or less, for example. The adoption of the percentage makes advantageous effects of a preferred embodiment of the present invention more significant.

It is to be noted that the respective lengths of the first and second portions 15a, 15b of the first external electrode 15, and of the fifth and sixth portions 16a, 16b of the second external electrode 16 in the laminating direction T can be obtained by observing the end surfaces of the ceramic capacitor with the use of a metallograph, and measuring the maximum lengths in the laminating direction T.

The respective lengths of the third and fourth portions 15c, 15d of the first external electrode 15, and of the seventh and eighth portions 16c, 16d of the second external electrode 16 in the laminating direction T can be obtained by observing the end surfaces of the ceramic capacitor with the use of a metallograph, and measuring the maximum lengths in the width direction W.

Figure 10:
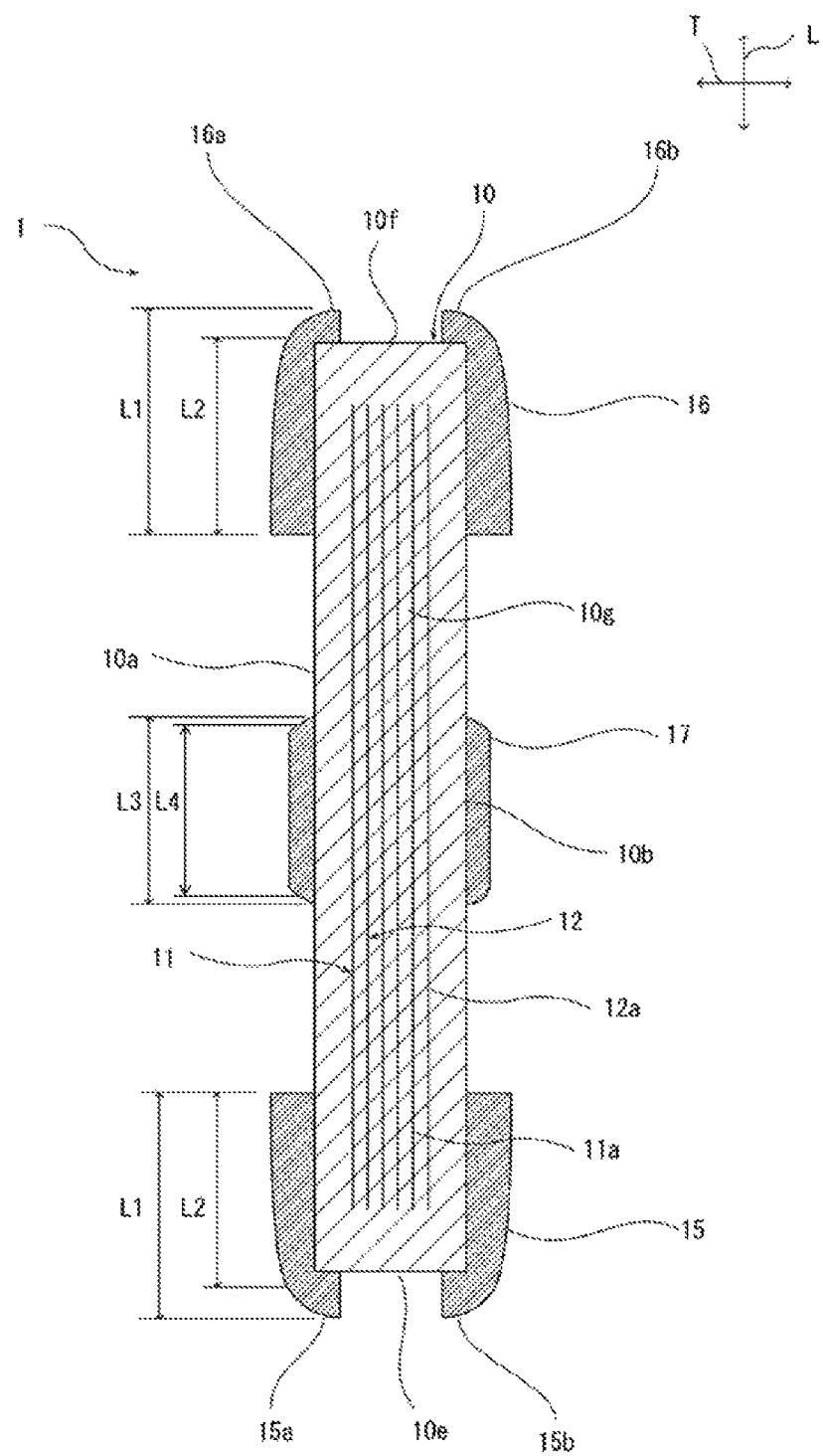
FIG. 10 is a schematic plan view of a capacitor according to a preferred embodiment of the present invention.

As shown in FIG. 10 when the maximum length in the length direction L, of portions of the first and second external electrodes 15, 16 located on the first or second principal surface 10a, 10b, is denoted by L1, whereas the maximum length in the length direction L from a portion farthest from the capacitor main body 10 in the laminating direction T, of the portions of the first and second external electrodes 15, 16 located on the first or second principal surface 10a, 10b, to a portion retreated to the capacitor main body 10 by about 40% of the thickness of the first or second external electrode 15, 16 in the laminating direction T is denoted by L2, the ratio L2/L1 is preferably about 80% or more and about 90% or less, for example.

According to this configuration, the shocks applied to the ridges of the ceramic capacitor 1 are diffused effectively in mounting the ceramic capacitor 1 onto a substrate, and breakages and cracks are thus prevented in the case of mounting the ceramic capacitor 1. In addition, the surface areas of flat portions of the first and second external electrodes 15, 16 are thus able to be increased, and excellent electrical connection is thus achieved between via hole electrodes and the first and second external electrodes 15, 16.

It is to be noted that while the advantageous effect is achieved even when the ratio L2/L1 is adjusted to about 80% or more and about 90% or less for any one of the first external electrode 15 and the second external electrode 16, a greater effect is achieved by adjusting the ratio L2/L1 to about 80% or more and about 90% or less for both of the first external electrode 15 and the second external electrode 16, for example.

When the maximum length in the length direction L, of a portion of the third external electrode 17 located on the first or second principal surface 10a, 10b, is denoted by L3, whereas the maximum length in the length direction from a portion farthest from the capacitor main body 10 in the laminating direction T, of the a portion of the third external electrode 17 located on the first or second principal surface 10a, 10b, to a portion closer to the capacitor main body 10 by about 40% of the thickness of the third external electrode 17 in the laminating direction T is denoted by L4, the ratio L4/L3 is preferably about 80% or more, for example.

According to this configuration, the surface areas of flat portions of the first and second external electrodes 15, 16 are able to be increased, and excellent electrical connection is thus achieved between via hole electrodes and the first and second external electrodes 15, 16.

The respective lengths of the first, second, fifth, and sixth portions 15a, 15b, 16a, 16b in the laminating direction T are preferably smaller than the lengths of the third, fourth, seventh, and eighth portions 15c, 15d, 16c, 16d in the width direction. In this case, it becomes possible to reduce not only the first, second, fifth, and sixth portions 15a, 15b, 16a, 16b, but also the external electrodes 15, 16 in thickness in the laminating direction T, thus making the ceramic capacitor 1 thinner. Therefore, the ceramic capacitor 1 has a structure that is more suitable to mounted onto a built-in electronic component substrate.

In the ceramic capacitor 1 according to the present preferred embodiment, when the lengths of the portions of the third external electrode 17 located on the first and second principal surfaces 10a, 10b in the length direction L are denoted by A, whereas the lengths of the portions of the third external electrode 17 located on the first and second side surfaces 10c, 10d in the length direction L are denoted by B, the magnitude relationship A>B is satisfied. According to this configuration, the areas of the portions of the third external electrode 17 located on the first and second principal surfaces 10a, 10b are able to be increased. For this reason, the area is able to be increased which can be irradiated with laser light to form a via hole leading to the third external electrode 17 of the ceramic capacitor 1 in a substrate with the ceramic capacitor 1 embedded therein. Accordingly, defective connections are prevented between the via hole electrode and the ceramic capacitor 1. In addition, the degree of freedom is improved for the location of the via hole electrode.

In addition, the magnitude relationship of A>B increases the area of exposure, from the external electrodes 15 to 17, of the side surfaces 10c, 10d of the capacitor main body 10 which includes higher adhesion to the substrate than the surface of the third external electrode 17. Therefore, the area of contact is able to be increased between the side surfaces 10c, 10d and the resin of the substrate. Accordingly, the adhesion between the substrate and the ceramic capacitor 1 is able to be improved. As a result, migration is effectively prevented from being caused by ingress of water from between the substrate and the ceramic capacitor.

From the perspective of preventing defective connections between via hole electrodes and the ceramic capacitor 1 in a more effective manner, and from the perspective of further improving the adhesion between the substrate and the ceramic capacitor 1, thus preventing migration in a more effective manner, the ratio B/A is preferably about 0.96 or less, for example.

From the perspective of keeping the internal electrodes from being exposed, and from the perspective of adequately ensuring the distances between the first and second external electrodes 15, 16 and the third external electrode 17, the ratio B/A is preferably about 0.77 or more, for example.

In the ceramic capacitor 1 according to the present preferred embodiment, when the lengths of the portions of the first and second external electrodes 15, 16 located on the first and second principal surfaces 10a, 10b in the length direction L are denoted by C, whereas the lengths of the portions of the first and second external electrodes 15, 16 located on the first and second side surfaces 10c, 10d in the length direction L are denoted by D, the magnitude relationship C>D is satisfied. For this reason, the areas of the portions of the first and second external electrodes 15, 16 located on the first and second principal surfaces 10a, 10b can be increased. For this reason, the area is able to be increased which can be irradiated with laser light for forming via holes leading to the first and second external electrodes 15, 16 of the ceramic capacitor 1 in a substrate with the ceramic capacitor 1 built therein. Accordingly, defective connections are prevented between the via hole electrode and the ceramic capacitor 1. In addition, the degree of freedom is able to be improved for the location of the via hole electrode. In addition, the portions of the first and second external electrodes 15, 16 located on the first and second side surfaces 10c, 10d are smaller in width than the portions of the first and second external electrodes 15, 16 located on the first and second principal surfaces 10a, 10b, and the capacitor main body 10 which includes higher adhesion to a substrate than the surfaces of the first and second external electrodes 15, 16 can be thus increased in exposed portion area. For this reason, the adhesion is improved between the ceramic capacitor 1 and the substrate. Therefore, the ceramic capacitor 1 and the substrate are kept from being separated from each other, which would cause ingress of water and the like from the separated portion. As a result, short circuits due to migration are prevented between the first external electrode 15 and the second external electrode 16.

From the perspective of preventing defective connections between via hole electrodes and the ceramic capacitor 1 in a more effective manner, and from the perspective of further improving the adhesion between the substrate and the ceramic capacitor 1, thus preventing migration in a more effective manner, the ratio D/C is preferably about 0.96 or less, for example.

From the perspective of keeping the internal electrodes from being exposed, and from the perspective of adequately ensuring the distances between the first and second external electrodes 15, 16 and the third external electrode 17, the ratio D/C is preferably about 0.78 or more, for example.

Method for Manufacturing Ceramic Capacitor 1

Next, an example of a method for manufacturing the ceramic capacitor 1 will be described.

First, ceramic green sheets, a conductive paste for internal electrodes, and a conductive paste for external terminal electrodes are prepared. The ceramic green sheets and the conductive pastes may contain a binder and a solvent. For the binder and solvent for use in the ceramic green sheets and the conductive pastes, for example, known binders and solvents can be used.

Next, onto the ceramic green sheets, the conductive paste is applied in predetermined patterns by, for example, a screen printing method or a gravure printing method, thus forming internal electrode patterns.

Next, the ceramic green sheets for outer layers without any internal electrode pattern applied by printing are laminated to reach a predetermined number of sheets, the ceramic green sheets with the internal electrode patterns applied by printing are sequentially laminated thereon, and the ceramic green sheets for outer layers are laminated thereon to reach a predetermined number of sheets, thus preparing a mother laminated body. Thereafter, the mother laminated body is subjected to pressing in the laminating direction by isostatic pressing, for example.

Next, the mother laminated body is cut into a predetermined size, thus cutting out a raw ceramic laminated body. In this regard, the raw ceramic laminated body may include corners and ridges rounded by barrel polishing or the like.

The base electrode paste is applied onto exposed portions of internal electrodes, which are exposed at side surfaces of the raw ceramic laminated body obtained by cutting into the predetermined size. The method for applying the base electrode paste is not limited. Examples of the method for applying the base electrode paste include, for example, a roller transfer method. Base electrode layers are formed by the roller transfer method, for example, the press pressure of a roller is controlled, thus making it possible to form the layers only on the side surfaces of the laminated body, or also on corners or ridges of the laminated body, and partially on principal surfaces of the laminated body.

It is to be noted that the roller transfer method preferably is specifically the following method. The application roller for the roller transfer method may be composed of an elastic body, or composed of a metal. The peripheral surface of the application roller includes grooves. The grooves of the application roller are filled with the base electrode paste, and the application roller in abutment with a chip side surface is moved on surface to transfer the base electrode paste to the chip side surface. It is to be noted that the raw ceramic laminated body may be moved in the roller rotation direction so as to be synchronized with the rotation of the roller, thus transferring the paste. In addition, after the transfer, a roller filled with no base electrode paste may be pressed against the chip end surface to remove the excessively transferred conductive paste.

Next, the raw ceramic laminated body is subjected to firing, thus providing the capacitor main body 10. The firing temperature is preferably, for example, about 900° C. or higher and about 1300° C. or lower, depending on the ceramic material and conductive material used. Thereafter, the capacitor main body 10 may be subjected to barrel polishing or the like, thus causing the capacitor main body 10 to include ridges and corners rounded.

Next, thin-film electrode layers are formed. First, for the thin-film electrode layers, the fired capacitor main body 10 with the base electrode layers formed is inserted in a dedicated mask jig. This mask jig is configured to be capable of exposing only regions where the thin-film electrode layers are required to be formed. Then, with the exposure of only regions of the principal surfaces of the capacitor main body 10 where external electrodes are required to be formed, the capacitor main body 10 is supplied to sputtering equipment, thus forming, by a sputtering method or the like, the thin-film electrode layers on the predetermined regions of the principal surfaces of the capacitor main body 10. For example, the thin-film electrode layers (thin-film electrode layers in contact with the capacitor main body 10) are formed which have, for example, two layers of a NiCr film and a NiCu film.

Next, plated layers are formed on the thin-film electrode layers, thus completing the external electrodes 15 to 17. The plated layers may each include a single layer or a plurality of layers, but include an outermost layer composed of a Cu plated layer. The plated layers may be formed by, for example, an electrolytic plating method, an electroless plating method, or the like.

In the case of forming the plated layers by an electrolytic plating method, specifically, a plating bath filled with a plating solution, and a cathode electrode and an anode electrode are prepared. In the plating solution, a plating voltage is applied between the cathode electrode and the anode electrode, thus applying a current in such way that the cathode electrode is brought into contact with the sintered electrode layer formed on the capacitor main body 10. Thus, a plated layer is deposited on the sintered electrode layer. It is to be noted that conductive media may be put in the plating solution along with the capacitor main body 10, thus applying a current to the sintered electrode layer of the capacitor main body 10 through the conductive media. It is to be noted that, for example, a vibration plating method of carrying out plating by stirring the capacitor main body 10 and conductive media with vibrations, a rotation barrel plating method of carrying out plating while rotationally stirring conductive media and the capacitor main body 10 put in a barrel, a centrifugal plating method of carrying out plating by stirring the capacitor main body 10 with the centrifugal force of a barrel, or the like is preferably used as the method for applying a current to the fired electrode layer.

Furthermore, if necessary, a heat treatment and a surface treatment for the external electrodes are carried out. The heat treatment densifies the external electrodes 15 to 17, thus improving the reliability. In addition, the surfaces of the external electrodes 15 to 17 are able to be made rough by applying the surface treatment to the surfaces of the external electrodes 15 to 17, and in the case of embedding into a substrate for built-in components, the adhesion is improved between the resin of the substrate and the external electrodes 15 to 17.

The ceramic capacitor 1 can be manufactured through the foregoing steps.

Preferred embodiments of the present invention will be described in more detail below with reference to specific examples, but the present invention is not to be considered limited to the following examples in any way, and appropriate modifications can be made in the practice of the present invention without departing from the scope of the present invention.

Example 1

With the use of the manufacturing method described with reference to the preferred embodiments described above, 1000 capacitors configured in substantially the same fashion as the ceramic capacitors 1 according to the preferred embodiments were prepared under the following conditions.

Conditions:

Dimensions of Ceramic Capacitor (Standard Dimension): L×W×T=1.000 mm×0.600 mm×0.220 mm Ceramic Material: $BaTi_2O_3$ Capacitance: 1 μF Rated Voltage: 6.3 V Structure of External Electrode: Base Electrode Layer/Thin Film Electrode Layer/Plated Layer Base Electrode Layer: Ni Fired Electrode Layer Thin Film Electrode Layer: NiCr Sputtered Film/NiCu Sputtered Film Plated Layer: Single Cu Plated Layer Thickness of Base Electrode Layer (Central Part): 6 μm Thickness of Thin Film Electrode Layer (Central Part): 0.3 μm in total (0.15 μm for each layer)

Thickness of Plated Layer (Central Part): 10 μm

Comparative Examples 1 to 4

In the same way as Example 1 except that the dimensions shown in Table 1 were adopted for A, B, C, and D, 1000 samples were prepared.

Method for Measuring A, B, C, D

A microscope (VHX-5000 from Keyence Corporation/100-fold magnification) was used to measure the widths of the external electrodes in the centers of the first and second principal surfaces in the width direction, and the widths of the external electrodes in the centers of the first and second side surfaces in the laminating direction. This measurement was made for ten samples. The A was obtained by calculating the average value of: the width of the third external electrode in the center of the first principal surface in the width direction; and the width of the third external electrode in the center of the second principal surface in the width direction, for the ten samples subjected to the measurement. The B was obtained by calculating the average value of: the width of the first external electrode in the center of the first side surface in the laminating direction; and the width of the first external electrode in the center of the second side surface in the laminating direction, for the ten samples subjected to the measurement. The B was obtained by calculating the average value of: the width of the first external electrode in the center of the first side surface in the laminating direction; and the width of the first external electrode in the center of the second side surface in the laminating direction, for the ten samples subjected to the measurement. The C was obtained by calculating the average value of: the width of the first external electrode in the center of the first principal surface in the width direction; the width of the first external electrode in the center of the second principal surface in the width direction; the width of the second external electrode in the center of the first principal surface in the width direction; and the width of the second external electrode in the center of the second principal surface in the width direction, for the ten samples subjected to the measurement. The D was obtained by calculating the average value of: the width of the first external electrode in the center of the first side surface in the laminating direction; the width of the first external electrode in the center of the second side surface in the laminating direction; the width of the second external electrode in the center of the first side surface in the laminating direction; and the width of the second external electrode in the center of the second side surface in the laminating direction, for the ten samples subjected to the measurement.

Evaluation of Connection to Via Hole Electrode

The ceramic capacitors prepared according to the example and each comparative example were embedded in substrates, thus preparing built-in ceramic capacitor substrates. Next, side surfaces of the built-in ceramic capacitor substrates were polished until the centers were exposed in planar views of via hole electrodes. The cross sections were observed with the use of a metallograph (MM-60 from NIKON CORPORATION), and the number of defective products was counted when the substrate where the first to third external electrodes were all connected to the via hole electrodes was regarded as a non-defective product, whereas the substrate where at least one of the external electrodes failed to be connected to the via hole electrode was regarded as a defective product. The results are shown in Table 1.

Thermal Shock Test

The ceramic capacitors prepared according to the example and each comparative example were embedded in substrates, thus preparing built-in ceramic capacitor substrates. It is to be noted that Flame Retardant Type 4 (RF4) was used as a resin constituting the substrates. Next, the built-in ceramic capacitor substrates were subjected to a thermal shock test under the following conditions.

Thermal Shock Cycle Test: −55° C./30 min to 125° C./30 min

Number of Cycles: 1000 cycles

Thereafter, side surfaces of the built-in ceramic capacitor substrates were polished to expose the ceramic capacitors, and the number of defective products was counted when the substrate where peeling of 50 μm×50 μm or more in size was caused at the interface between the ceramic capacitor and the substrate was regarded as a defective product. The results are shown in Table 1.

Conditions:

Dimensions of Ceramic Capacitor: L×W×T=1.000 mm×0.600 mm×0.220 mm

Ceramic Material: $BaTi_2O_3$

Capacitance: 1 μF

Rated Voltage: 6.3 V

Structure of External Electrode: Base Electrode Layer/Thin Film Electrode Layer/Plated Layer Base Electrode Layer: Ni Fired Electrode Layer Thin Film Electrode Layer: NiCr Sputtered Film/NiCu Sputtered Film Plated Layer: Single Cu Plated Layer Thickness of Base Electrode Layer (Central Part): 6 μm Thickness of Thin Film Electrode Layer (Central Part): 0.3 μm in total (0.15 μm for each layer)

Thickness of Plated Layer (Central Part): 10 μm (Distance in Length Direction Between First External Electrode and Third External Electrode and Distance in Length Direction Between Second External Electrode and Third External Electrode)

The first principal surfaces of the ceramic capacitors prepared were observed to measure the distance in the length direction between the first external electrode and the third external electrode and the distance in the length direction between the second external electrode and the third external electrode. The number of defective products was counted when the ceramic capacitor where the measured distance was equal to or less than the standard dimension was regarded as a defective Gap dimension product. The results are shown in Table 2.

Evaluation of Connection to Via Hole Electrode

The evaluation was made in the same way as the evaluation method described above. The results are shown in Table 2.

TABLE 1

| A (μm) | B (μm) | C (μm) | D (μm) | Relation between A and B and Relation between C and D | Number of Products with Defective Connection to Via Hole Electrode/Number of Samples | Number of Defective Products in Thermal Shock Test/Number of Samples |
|---|---|---|---|---|---|---|
| Example 1 | | | | | | |
| 279 | 234 | 255 | 220 | A > B, C > D | 0/1000 | 0/32 |
| Comparative Example 1 | | | | | | |
| 241 | 242 | 221 | 224 | A ≈ B, C ≈ D | 9/1000 | 0/32 |
| Comparative Example 2 | | | | | | |
| 199 | 237 | 195 | 222 | A < B, C < D | 95/1000 | 0/32 |
| Comparative Example 3 | | | | | | |
| 280 | 280 | 249 | 249 | A = B, A = B | 0/1000 | 4/32 |
| Comparative Example 4 | | | | | | |
| 281 | 318 | 250 | 277 | A < B, C < D | 0/1000 | 11/32 |

From the results shown in Table 1, it is determined that the adoption of the magnitude relationships A>B and C>D achieve ceramic capacitors which are excellent in connection between via hole electrodes and external electrodes of the ceramic capacitors, less likely to be peeled from substrates when thermal shocks are applied, and thus suitable to be built into substrates.

Experimental Example

With the use of the manufacturing method described with reference to the preferred embodiments described above, a plurality of capacitors configured in substantially the same fashion as the ceramic capacitors 1 according to the preferred embodiments were prepared under the following conditions and the conditions shown in Table 2.

Thermal Shock Test

The evaluation was made in the same way as the evaluation method described above. The results are shown in Table 2.

Presence or Absence of Exposed Internal Electrode

The first side surfaces of the samples prepared were observed, and the number of defective products was counted when the sample where the internal electrode was exposed was regarded as a defective product with an internal electrode exposed. The results are shown in Table 2.

TABLE 2

| A (μm) | B (μm) | B/A | C (μm) | D (μm) | D/C | Number of Defective Gap Dimension Products/Number of Products | Number of Products with Defective Connection to Via Hole Electrode/ Number of Samples | Number of Defective Products in Thermal Shock Test/ Number of Samples | Number of Defective Products with Internal Electrode Exposed/ Number of Samples |
|---|---|---|---|---|---|---|---|---|---|
| 351 | 241 | 0.69 | 233 | 199 | 0.85 | 91/100 | 0/100 | 0/32 | 0/50 |
| 329 | 241 | 0.73 | 235 | 203 | 0.85 | 14/100 | 0/100 | 0/32 | 0/50 |
| 308 | 237 | 0.77 | 241 | 201 | 0.83 | 0/100 | 0/100 | 0/32 | 0/50 |
| 289 | 238 | 0.82 | 234 | 203 | 0.87 | 0/100 | 0/100 | 0/32 | 0/50 |
| 253 | 243 | 0.96 | 233 | 198 | 0.85 | 0/100 | 0/100 | 0/32 | 0/50 |
| 241 | 242 | 1.00 | 242 | 196 | 0.81 | 0/100 | 15/100 | 0/32 | 0/50 |
| 199 | 237 | 1.19 | 240 | 202 | 0.84 | 0/100 | 89/100 | 0/32 | 0/50 |
| 282 | 293 | 1.04 | 240 | 198 | 0.83 | 0/100 | 0/100 | 15/32 | 0/50 |
| 280 | 282 | 1.01 | 241 | 200 | 0.83 | 0/100 | 0/100 | 4/32 | 0/50 |
| 279 | 267 | 0.96 | 244 | 199 | 0.82 | 0/100 | 0/100 | 0/32 | 0/50 |
| 276 | 240 | 0.87 | 234 | 204 | 0.87 | 0/100 | 0/100 | 0/32 | 0/50 |
| 277 | 212 | 0.77 | 239 | 203 | 0.85 | 0/100 | 0/100 | 0/32 | 0/50 |
| 277 | 200 | 0.72 | 238 | 196 | 0.82 | 0/100 | 0/100 | 0/32 | 23/50 |
| 275 | 179 | 0.65 | 240 | 200 | 0.83 | 0/100 | 0/100 | 0/32 | 50/50 |
| 278 | 238 | 0.86 | 352 | 239 | 0.68 | 82/100 | 0/100 | 0/32 | 0/50 |
| 280 | 240 | 0.86 | 328 | 238 | 0.73 | 11/100 | 0/100 | 0/32 | 0/50 |
| 282 | 241 | 0.85 | 310 | 241 | 0.78 | 0/100 | 0/100 | 0/32 | 0/50 |
| 282 | 244 | 0.87 | 281 | 238 | 0.85 | 0/100 | 0/100 | 0/32 | 0/50 |
| 279 | 234 | 0.84 | 251 | 240 | 0.96 | 0/100 | 0/100 | 0/32 | 0/50 |
| 277 | 239 | 0.86 | 240 | 242 | 1.01 | 0/100 | 9/100 | 0/32 | 0/50 |
| 281 | 238 | 0.85 | 224 | 237 | 1.06 | 0/100 | 76/100 | 0/32 | 0/50 |
| 280 | 241 | 0.86 | 277 | 293 | 1.06 | 0/100 | 0/100 | 24/32 | 0/50 |
| 281 | 244 | 0.87 | 279 | 281 | 1.01 | 0/100 | 0/100 | 9/32 | 0/50 |
| 277 | 234 | 0.84 | 282 | 269 | 0.95 | 0/100 | 0/100 | 0/32 | 0/50 |
| 283 | 239 | 0.84 | 283 | 243 | 0.86 | 0/100 | 0/100 | 0/32 | 0/50 |
| 282 | 238 | 0.84 | 277 | 215 | 0.78 | 0/100 | 0/100 | 0/32 | 0/50 |
| 283 | 242 | 0.86 | 281 | 197 | 0.70 | 0/100 | 0/100 | 0/32 | 18/50 |
| 275 | 242 | 0.88 | 277 | 177 | 0.64 | 0/100 | 0/100 | 0/32 | 50/50 |

From the results shown in Table 2, it is determined that the ratio B/A is preferably adjusted to about 0.77 or more and about 0.96 or less, whereas the ratio D/C is preferably adjusted to about 0.78 or more and about 0.96 or less, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic capacitor comprising:
   a capacitor main body including first and second principal surfaces extending in a length direction and a width direction perpendicular or substantially perpendicular to the length direction, first and second side surfaces extending in the length direction and a laminating direction perpendicular or substantially perpendicular to each of the length direction and the width direction, and first and second end surfaces extending in the width direction and the laminating direction;
   a plurality of internal electrodes disposed in the capacitor main body, and exposed at each of the first and second side surfaces; and
   a plurality of external electrodes extending over exposed portions of the internal electrodes at the first side surface and exposed portions of the internal electrodes at the second side surface to the first and second principal surfaces; wherein
   each of the plurality of internal electrodes includes:
      a first internal electrode; and
      a second internal electrode opposed to the first internal electrode in the laminating direction;
   the first internal electrode includes:
      a first opposed portion opposed to the second internal electrode;
      first and second extended portions connected to the first opposed portion, and each extended to the first side surface; and
      third and fourth extended portions connected to the first opposed portion, and each extended to the second side surface;
   the second internal electrode includes:
      a second opposed portion opposed to the first opposed portion;
      a fifth extended portion connected to the second opposed portion, and extended to the first side surface; and
      a sixth extended portion connected to the second opposed portion, and extended to the second side surface;
   each the plurality of external electrodes includes:
      a first external electrode covering an exposed portion of the first extended portion at the first side surface and an exposed portion of the third extended portion at the second side surface, and wrapping around the first side surface, the first principal surface, the second side surface, and the second principal surface;
      a second external electrode covering an exposed portion of the second extended portion at the first side surface and an exposed portion of the fourth extended portion at the second side surface, and wrapping around the first side surface, the first principal surface, the second side surface, and the second principal surface; and
a third external electrode covering an exposed portion of the fifth extended portion at the first side surface and an exposed portion of the sixth extended portion at the second side surface, and wrapping around the first side surface, the first principal surface, the second side surface, and the second principal surface;

each of the first, second, and third external electrodes includes an outermost layer including a Cu plated layer;
the third external electrode is located between the first external electrode and the second external electrode in the length direction;
the first external electrode includes:
  a first portion extending from a portion located on the first principal surface to a portion of the first end surface;
  a second portion extending from a portion located on the second principal surface to a portion of the first end surface;
  a third portion extending from a portion located on the first side surface to a portion of the first end surface; and
  a fourth portion extending from a portion located on the second side surface to a portion of the first end surface,
the second external electrode includes:
  a fifth portion extending from a portion located on the first principal surface to a portion of the second end surface;
  a sixth portion extending from a portion located on the second principal surface to a portion of the second end surface;
  a seventh portion extending from a portion located on the first side surface to a portion of the second end surface; and
  an eighth portion extending from a portion located on the second side surface to a portion of the second end surface;
the first end surface includes a central portion exposed from the first external electrode;
the second end surface includes a central portion exposed from the second external electrode;
widths of portions of the third external electrode located on the first and second principal surfaces in the length direction are denoted by A;
widths of portions of the third external electrode located on the first and second side surfaces in the length direction are denoted by B;
a relationship of A>B is satisfied;
widths of portions of the first and second external electrodes located on the first and second principal surfaces in the length direction are denoted by C;
widths of portions of the first and second external electrodes located on the first and second side surfaces in the length direction are denoted by D;
a relationship of C>D is satisfied; and
each of the first and second external electrodes has a maximum thickness in the lamination direction at a side towards a center of the capacitor main body in the length direction, and each of the thicknesses of the first and second external electrodes decreases towards the respective first and second end surfaces of the capacitor main body in the length direction.

2. The ceramic capacitor according to claim 1, wherein a ratio B/A is about 0.77 or more and about 0.96 or less.

3. The ceramic capacitor according to claim 1, wherein a ratio D/C is about 0.78 or more and about 0.96 or less.

4. The ceramic capacitor according to claim 1, wherein
lengths of the first and second portions, and lengths of the fifth and sixth portions in the laminating direction are each about 5% or more and about 15% or less of a dimension of the ceramic capacitor in the laminating direction; and
lengths of the third and fourth portions, and lengths of the seventh and eighth portions in the laminating direction are each about 5% or more and about 15% or less of a width dimension of the ceramic capacitor.

5. The ceramic capacitor according to claim 1, wherein respective lengths of the first, second, fifth, and sixth portions in the laminating direction are smaller than lengths of the third, fourth, seventh, and eighth portions in the width direction.

6. The ceramic capacitor according to claim 1, wherein the capacitor main body has a cuboid or substantially cuboid shape.

7. The ceramic capacitor according to claim 1, wherein
a width dimension of the capacitor main body is denoted as DW;
a height dimension of the capacitor main body is denoted as DT;
a length dimension of the capacitor main body is denoted as DL;
DW, DT and DL satisfy following relationships:

$$DT<DW<DL; \text{ and}$$

$$(\text{about } 1/7)DW \leq DT \leq (\text{about } 1/3)DW.$$

8. The ceramic capacitor according to claim 1, wherein
a width dimension of the capacitor main body is denoted as DW;
a height dimension of the capacitor main body is denoted as DT;
a length dimension of the capacitor main body is denoted as DL;
DW, DT and DL satisfy following relationships:

$$0.05 \text{ mm} \leq DT \leq \text{about } 0.25 \text{ mm};$$

$$\text{about } 0.4 \text{ mm} \leq DL \leq \text{about } 1 \text{ mm; and}$$

$$\text{about } 0.3 \text{ mm} \leq DW \leq \text{about } 0.5 \text{ mm}.$$

9. The ceramic capacitor according to claim 1, wherein a dimension of the ceramic capacitor in the laminating direction is about 1/5 times or more and about 1/2 times or less as large as the width dimension.

10. The ceramic capacitor according to claim 1, wherein a ceramic portion between adjacent ones of the plurality of internal electrodes is about 0.5 μm or more and about 10 μm or less in thickness.

11. The ceramic capacitor according to claim 1, wherein each of the plurality of internal electrodes has a thickness of about 0.2 μm or more and about 2 μm or less.

12. The ceramic capacitor according to claim 1, wherein each of the plurality of external electrodes has a thickness of about 190 μm or more and about 270 μm or less.

13. The ceramic capacitor according to claim 1, wherein the capacitor main body is embedded in a substrate that includes a plurality of via holes that are electrically continuous with the plurality of external electrodes.

14. The ceramic capacitor according to claim 1, wherein each of the plurality of external electrodes includes a base electrode layer and a thin film electrode layer.

15. The ceramic capacitor according to claim 14, wherein
a thickness of the base electrode layer is about 1 μm or more;
a thickness of the thin film electrode layer is about 0.05 μm or more and about 1 μm or less; and
a thickness of the Cu plated layer is about 1 μm or more and about 15 μm or less.

16. The ceramic capacitor according to claim 1, wherein a thickness of a portion of the third external electrode provided on the first or second principal surface is smaller than thicknesses of portions of the first and second external electrodes.

17. The ceramic capacitor according to claim 1, wherein a difference in a thickness of a portion of the third external electrode provided on the first or second principal surface and thicknesses of portions of the first and second external electrodes is about 0.5 μm or more.

18. The ceramic capacitor according to claim 1, wherein
the first, second, third and fourth portions cover ridges of the main capacitor body including the first end surface and each of the first and second principal surfaces and first and second side surfaces; and
the fifth, sixth, seventh and eighth portions cover ridges of the main capacitor body including the second end surface and each of the first and second principal surfaces and first and second side surfaces.

* * * * *